United States Patent
Nakada

Patent Number: 5,872,724
Date of Patent: Feb. 16, 1999

[54] SIMULATION APPARATUS AND SIMULATION METHOD FOR SEMICONDUCTOR INTEGRATED CIRCUIT

[75] Inventor: Masami Nakada, Hamamatsu, Japan

[73] Assignee: Yamaha Corporation, Hamamatsu, Japan

[21] Appl. No.: 694,942

[22] Filed: Aug. 9, 1996

[30] Foreign Application Priority Data

Aug. 10, 1995 [JP] Japan .................................. 7-204554

[51] Int. Cl.$^6$ .................................................. G06F 17/50
[52] U.S. Cl. ........................................... 364/578; 364/489
[58] Field of Search ..................................... 364/489, 488, 364/578, 490; 395/500; 371/22.1, 22.2, 27.4, 27.5

[56] References Cited

U.S. PATENT DOCUMENTS

| | | | |
|---|---|---|---|
| 5,051,938 | 9/1991 | Hyduke .................................. | 364/578 |
| 5,305,229 | 4/1994 | Dhar .................................... | 364/489 |
| 5,446,676 | 8/1995 | Huang et al. ......................... | 364/578 |
| 5,461,575 | 10/1995 | Schucker et al. .................... | 364/489 |
| 5,553,008 | 9/1996 | Huang et al. ......................... | 364/578 |

OTHER PUBLICATIONS

Lee et al., "EDLICS: A New Relaxation–Based Electrical Circuit Simulation Technique", IEEE, 1994, pp. 1–4.
Sarin et al., "A Power Modeling and Characterization Method for Logic Simulation", IEEE, 1995, pp. 16.1.1–16.1.4.

*Primary Examiner*—Vincent N. Trans
*Assistant Examiner*—Thai Phan
*Attorney, Agent, or Firm*—Pillsbury Madison & Sutro

[57] ABSTRACT

A simulation apparatus for a semiconductor integrated circuit is provided that includes model preparing device, logic simulating device and power supply voltage drop simulating device. The model preparing device prepares a feeder system model including current sources that correspond to respective circuit elements constituting a circuit to be designed, and power supply wiring and ground wiring for applying voltage to the current sources, on the basis of a result of automatic layout of the circuit. The logic simulating device implements logic simulation of the circuit, and outputs event information related to the circuit elements which have undergone a change of a condition thereof. The power supply voltage drop simulating device implements simulation while driving the current sources in the feeder system model that correspond to the circuit elements listed in the event information, and computing voltage drop in the power supply wiring and the ground wiring.

4 Claims, 4 Drawing Sheets

FIG.3A  FIG.3B  FIG.3C
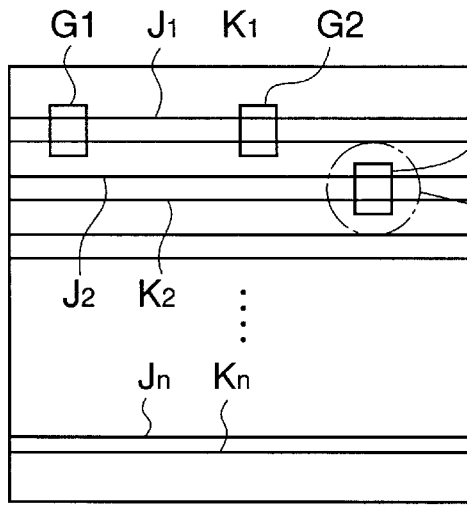
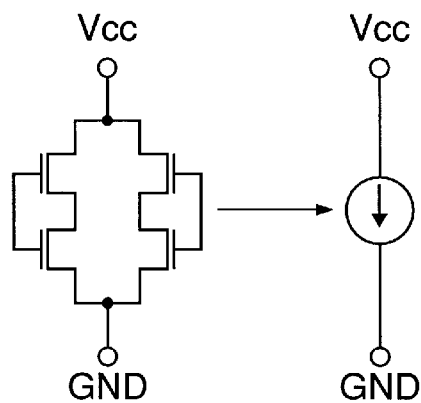
FIG.4
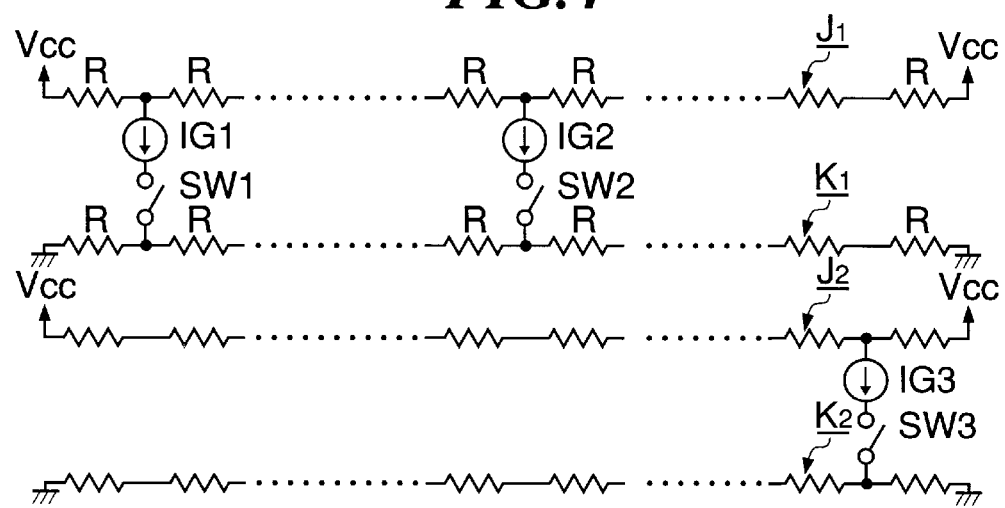

SIMULATION APPARATUS AND SIMULATION METHOD FOR SEMICONDUCTOR INTEGRATED CIRCUIT

BACKGROUND OF THE INVENTION

1. Field of the Invention

The present invention relates to a simulation apparatus and method for simulating the operation of a semiconductor integrated circuit, such as a gate-array device.

2. Prior Art

A process of manufacturing a semiconductor integrated circuit is roughly divided into a diffusion process for forming elements, such as transistors and resistors, on a semiconductor wafer, and a wiring or metallizing process for forming a wiring pattern for connecting these elements with each other. Gate-array devices are manufactured such that a common diffusion process is employed for individual devices, and the wiring process is effected in a manner that is different from one device to another. To develop each of the gate-array devices, a mask needs to be produced for forming an intended electronic circuit of the relevant gate-array device on a semiconductor substrate. In this connection, mask-pattern information needed to produce the mask is automatically prepared by an automatic layout processing implemented by a CAD (Computer Aided Design) tool.

In recent years, the CAD tool merely capable of automatic designing is not deemed satisfactory, and there is an increasing demand for a CAD tool capable of high-quality automatic designing. In particular, the electric performance of the resulting device or product depends on whether layout designing is good or not, and therefore numerous proposals have been made for ensuring the high quality of the final product at the stage of layout designing. One of the problems that are recently deemed significant from this point of view is that of voltage drop in a power supply wiring system within a chip. This problem will be explained in more detail.

A chip of a gate-array device has an internal core area 100 in which a plurality of cell rows each consisting of a multiplicity of cells 1, 1, . . . are arranged in parallel with each other, as shown in FIG. 6. Each of the cells 1 consists of a given number of transistors, and is formed in the same pattern. Various kinds of electronic circuits constituting individual gate-array devices are provided by wiring the transistors in each of these cells 1. Power is supplied to each of the cells so that the transistors in the relevant cell constitute a desired electronic circuit. In the example of FIG. 6, relatively wide power supply wire and ground wire (not shown) are formed on the right and left sides of the internal core area 100, and power supply wires J1–Jn and ground wires K1–Kn which longitudinally extends through the respective cell rows are connected to the above power supply wire and ground wire. Power is supplied to the transistors in each cell through these power supply wires J1–Jn and ground wires K1–Kn.

The width of the power supply wires J1–Jn and ground wires K1–Kn that longitudinally extends through the cell rows cannot be increased to a great extent in view of a requirement for an increased density of integration of the chip, resulting in a relatively large resistance per unit length of the wire. FIG. 7 shows a feeder system consisting of a power supply wire JX and a ground wire KX for supplying a power supply voltage Vcc to one of the cell rows. In this figure, R represents resistance of the wiring, and IA and IB represent current that flows in accordance with the operation of each of the transistors in the cell row. The power supply wire JX and ground wire KX undergo only a slight voltage drop due to flow of the current IA since the transistors causing the flow of the current IA are located near the end of the cell row. Accordingly, the power supply voltage Vcc is applied as it is to these transistors. On the other hand, the transistors causing flow of the current IB are located in the middle of the cell row, and therefore the flow of the current IB results in a relatively large voltage drop in the power supply wire JX and ground wire KX. Accordingly, a power supply voltage that is considerably lower than the original power supply voltage Vcc is applied to these transistors.

If the power supply voltage is thus reduced at respective parts of the internal core area 1, the circuit may operate in a way different from the intended one, and, in the worst case, may not be able to fulfill the intended function. In a general method of developing individual gate-array devices, for example, an electronic circuit to be designed for each of the devices is initially subjected to logical simulation, and layout designing and following steps are then carried out after it is confirmed through the simulation that the circuit can fulfill the intended function. The logical simulation is conducted on the assumption that a given power supply voltage is uniformly applied to the entire internal core area, with the delay time being set for each element of the circuit under this assumption. If the power supply voltage applied to each part of the internal core area 1 is reduced, the assumption on which the logical simulation is effected differs from that on which operating simulation is effected, whereby the circuit operates in a different way than the intended one, e.g., with varying delay time of signal transfer in the electronic circuit. Thus the normal operation may not be reproduced in the actual operation even if the normality is confirmed by the simulation.

To avoid the above situation, layout designing should be conducted so as not to cause an undesirably large voltage drop in a particular power supply wire or wires and the like. To this end, upon completion of automatic layout, current flowing through each circuit element disposed on each cell row needs to be checked to determine a magnitude of the voltage drop in the corresponding power supply wire or the like, and another automatic layout must be effected if a large voltage drop is detected in the power supply wire or the like. In the actual application, however, it is extremely difficult to check the current in advance with respect to all circuit elements constituting a large-scale circuit, and determine or quantify the voltage drop in the power supply wiring or the like in the chip. Accordingly, the following method is actually employed to check if a circuit fails to operate properly due to any voltage drop in its power supply wiring or the like; after the automatic layout is carried out, a mask is produced on the basis of the result of the layout, to make a prototype of each of the individual gate-array devices, and this prototype is evaluated in terms of the operation to determine whether a malfunction or the like exists in the prototype due to a voltage drop in the power supply wiring or the like.

SUMMARY OF THE INVENTION

It is therefore an object of the present invention to provide a simulation apparatus for a semiconductor integrated circuit, which is capable of determining voltage drop that may occur in power supply wiring and ground wiring in a semiconductor integrated circuit in the actual operation, without producing a prototype of the circuit, and a method for simulating the operation of the circuit.

The above object may be accomplished according to one aspect of the present invention, which provides a simulation apparatus for a semiconductor integrated circuit comprising: model preparing means for preparing a feeder system model including current sources that correspond to respective circuit elements constituting a circuit to be designed, and power supply wiring and ground wiring for applying voltage to the current sources, on the basis of a result of automatic layout of the circuit; logic simulating means for implementing logic simulation of the circuit, and outputting event information related to selected ones of the circuit elements constituting the circuit, which selected ones have undergone a change of a condition thereof; and power supply voltage drop simulating means for implementing simulation while driving the current sources in the feeder system model that correspond to the selected ones of the circuit elements listed in the event information, and computing voltage drop in the power supply wiring and the ground wiring.

In the simulation apparatus constructed as described above, the logic simulation is implemented after the automatic layer is completed, and the voltage drop in the power supply wiring and ground wiring within the circuit is automatically calculated on the basis of the result of the logic simulation. Thus the voltage drop simulation can be carried out in accordance with the logic simulation in which the result of the automatic layout is utilized. It is therefore possible to determine if the result of the automatic layout when used in the actual operation is good or not, before producing a prototype of the circuit.

The above object may be also accomplished according to a second aspect of the present invention, which provides a simulation apparatus for a semiconductor integrated circuit comprising: model preparing means for preparing a feeder system model including current sources that correspond to respective circuit elements constituting a circuit to be designed, and power supply wiring and ground wiring for applying voltage to the current sources, on the basis of a result of automatic layout of the circuit; logic simulating means for implementing logic simulation of the circuit, and counting a frequency of operation of each of the circuit elements constituting the circuit; and power supply voltage drop simulating means for calculating an average current flowing through each circuit element in the feeder system model, on the basis of a counting result of the frequency of operation of the circuit element, and computing voltage drop in the power supply wiring and ground wiring, which is to occur when the average current flows through the circuit element. The present simulation apparatus provides the same effects or advantages as described above with respect to the first aspect of the invention.

The same object may be accomplished according to a third aspect of the present invention, which provides a method for simulating a semiconductor integrated circuit, comprising the steps of: preparing a feeder system model including current sources that correspond to respective circuit elements constituting a circuit to be designed, and power supply wiring and ground wiring for applying voltage to the current sources, on the basis of a result of automatic layout of the circuit; implementing logic simulation of the circuit, and outputting event information related to selected ones of the circuit elements constituting the circuit, which selected ones have undergone a change of a condition thereof; and implementing simulation while driving the current sources in the feeder system model that correspond the selected ones of the circuit elements listed in the event information, and computing voltage drop in the power supply wiring and the ground wiring.

The above object may be also accomplished according to a fourth aspect of the present invention, which provides a method for simulating a semiconductor integated circuit, comprising the steps of: preparing a feeder system model including current sources that correspond to respective circuit elements constituting a circuit to be designed, and power supply wiring and ground wiring for applying voltage to the current sources, on the basis of a result of automatic layout of the circuit; implementing logic simulation of the circuit, and counting a frequency of operation of each of the circuit elements constituting the circuit; and calculating an average current flowing through the each circuit element in the feeder system model, on the basis of a counting result of the frequency of operation of the each circuit element, and computing voltage drop in the power supply wiring and ground wiring, which is to occur when the average current flows through the circuit element. The present simulating method yields the same effects or advantages as described above with respect to the first aspect of the invention. The present simulating method yields the same effects or advantages as described above with respect to the first aspect of the invention.

The above and other objects, features, and advantages of the invention will become more apparent from the following detailed description taken in conjunction with the accompanying drawings.

BRIEF DESCRIPTION OF THE DRAWINGS

The invention will be described in greater detail with reference to certain preferred embodiments thereof and the accompanying drawings, wherein:

FIG. 3A is a view showing an image of layout information used in the embodiment of FIG. 1;

FIG. 3B is a view showing a basic unit cell constituting a circuit element;

FIG. 3C is a view showing a symbol representing the basic unit cell of FIG. 3B;

FIG. 4 is a view showing an image of a feeder system model prepared in the embodiment of FIG. 1;

DETAILED DESCRIPTION OF THE PREFERRED EMBODIMENTS

To further clarify the concept of the present invention, there will be described presently preferred embodiments of the invention referring to accompanying drawings. It is to be understood that the present invention is not limited to details of these preferred embodiments but may be embodied with changes, modifications and improvements without departing from the scope of the invention.

Figure 1:
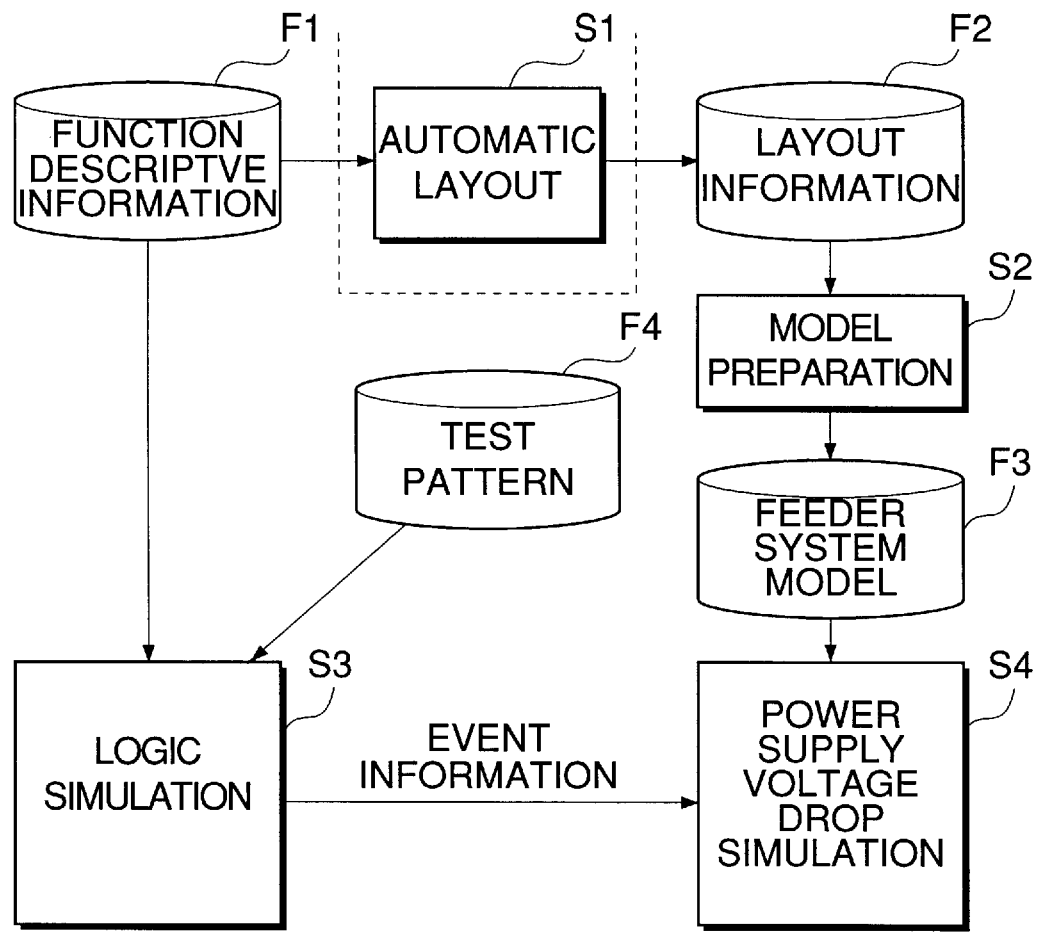
FIG. 1 is a block diagram showing the construction of a simulation apparatus for a semiconductor integrated circuit according to one embodiment of the present invention.

Referring first to FIG. 1, there is shown a system structure of a simulation apparatus according to the first embodiment of the present invention, which utilizes function descriptive information F1 that serves as input information for an automatic layout system S1 of a gate-array device, and layout information F2 received from this system S1.

Figure 2:
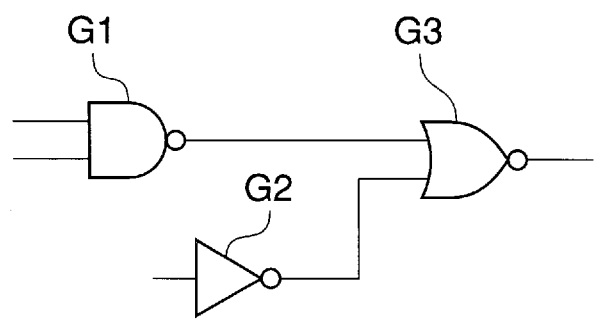
FIG. 2 is a view showing an image of function descriptive information used in the embodiment of FIG. 1.

The function descriptive information F1 used in the present apparatus consists of information defining the structure of a circuit to be designed, more specifically, a list describing what macro is to be used for each circuit element of the circuit, and how the wiring is to be provided between the circuit element and another circuit element. If the system to be designed includes a circuit consisting of circuit elements G1–G3 constituting a fixed channel type gate-array as shown in FIG. 2, for example, the function descriptive information is prepared to include information to the effect that these circuit elements G1, G2 and G3 use NAND gate, inverter and NOR gate as macros, and information to the effect that these macros are wired in the manner as shown in FIG. 2.

In the automatic layout system S1, there are preliminarily stored various kinds of libraries needed for automatic layout of individual gate-array devices, including a layout library defining artwork information (related to dimensions and shapes of patterns, for example) associated with transistors constituting the respective macros, wiring pattern and others. The automatic layout system S1 is adapted to implement layout processings referring to these libraries. The layout processings are roughly divided into two processings. In the first processing, a cell (hereinafter referred to as an artwork cell) including transistors, wiring pattern and others, which corresponds to each of the macros appearing in the function descriptive information, is virtually positioned or arranged in the internal core area. The artwork cell corresponding to each macro is prepared using the artwork information in the layout library which corresponds to the relevant macro. In the second processing, the wiring pattern, such as a pattern of signal wires connecting the respective art work cells virtually positioned in the internal core area, is produced. The wiring pattern for the signal wires is automatically produced according to the above-described function descriptive information.

The layout information F2 is an intermediate file representing the result of the first processing as one of the above-described processings. FIG. 3A shows an image of the layout information corresponding to the circuit as shown in FIG. 2. In this example, the artwork cell corresponding to the circuit element G1 is positioned near the left end of the first cell row, and the artwork cell corresponding to the circuit element G2 is positioned approximately in the middle of the first cell row, while the artwork cell corresponding to the circuit element G3 is positioned near the right end of the second cell row disposed below the first cell row. The layout information F2 includes information representing the positions of the artwork cells corresponding to the respective circuit elements G1–G3, and information indicating respective kinds of the macros corresponding to these circuit elements. Each of the circuit elements G1–G3 consist of one or a plurality of basic unit cell(s) as shown in FIG. 3B, and may be represented by a symbol (in which the current value differs from one circuit element from another) as shown in FIG. 3C.

The simulation apparatus according to the present embodiment of the invention consists of a model preparing portion S2, a logic simulation portion S3, and a power supply voltage drop simulation portion S4, as shown in FIG. 1.

The model preparing portion S2 prepares a feeder system model F3 on the basis of the layout information F2. The feeder system model F3 consists of information defining the structure of a circuit of a feeder system in which the circuit elements positioned in the internal core area through the automatic layout are connected to corresponding power supply wires and ground wires, with the circuit elements regarded as current loads. FIG. 4 shows an image of the feeder system model F3 prepared on the basis of the layout information as shown in FIG. 3. In FIG. 4, current sources IG1–IG3 are models of current consumed upon a single switching operation of the respective current elements G1–G3, and SW1–SW3 represent switches that are turned ON upon the switching operation of the current elements G1–G3. Resistances R, R, . . . represent those of respective portions of the power supply wire and ground wire that pass or traverse each of the cells. These resistances R have a constant or fixed value that is determined on the basis of the width of the power supply wire and ground wire.

The current value of each of the current sources depends on the number of transistors constituting the corresponding circuit element, for example. To determine the current value of the current source corresponding to each of the circuit elements, therefore, a library that stores current values of current sources with respect to respective macros is prepared in advance, and the current value of the macro corresponding to the relevant circuit element is obtained from this library. As described above, the layout information includes information representing the macro corresponding to each of the circuit elements, as well as the position of the artwork cell corresponding to each circuit element. Accordingly, the connecting positions of the current sources and current values with respect to all of the circuit elements of the circuit may be determined on the basis of the layout information.

The logic simulation portion S3 receives the function descriptive information F1 and a test pattern F4 (time series signal pattern defining an input waveform applied to the circuit, and a response waveform obtained from the circuit when the input waveform is applied) that is used for confirming the function. The logic simulation portion S3 implements logic simulation according to the information F1 and the test pattern 4. While this logic simulation may be implemented by a general method known as an event drive method or a table drive method, the information on events that have occurred in the circuit during the simulation with one test pattern is outputted each time the simulation proceeds to the next pattern in the present embodiment. When a large-scale circuit is subjected to the logic simulation, an enormous number of events generally occur during the simulation with respect to only one pattern. In the present embodiment, therefore, the circuit elements in which the output signal has been inverted from "1" to "0" or vice versa are selected from the circuit elements defined in the function descriptive information, and the event information comprising names of the selected ones of the circuit elements is outputted.

The power supply voltage drop simulation portion S4 implements simulation of the operation of the feeder system model F3 in association with the logic simulation conducted by the logic simulation portion S3. More specifically, when the event information is outputted from the logic simulation portion S3, the power source voltage drop simulation portion S4 detects the circuit elements listed in the event information which correspond to the event information, determines the current sources corresponding to these circuit elements in the feeder system model F3, and turns on switches corresponding to these current sources. Subsequently, the simulation portion S4 calculates current flowing through each of the power supply wires and ground wires of the feeder system model, and calculates a voltage drop at each point on the power supply wire and each point on the ground wire. This processing is implemented with respect to all the event information outputted from the logic simulation portion S3. In the circuit as shown in FIGS. 2–4, for example, if the event information outputted from the logic simulation portion S3 tells changes of output signals from the circuit elements G1, G2, the power supply voltage drop simulation portion S4 turns on the switches SW1 and SW2, and calculates in this condition a voltage drop at each point on the power supply wire J1 and ground wire K1. The above processing is implemented each time the logic simulation is completed with one pattern and proceed to the next one.

In the present embodiment as described above, voltage drops in the power supply wires and others in the internal core area can be automatically calculated by implementing the power supply voltage drop simulation in association with the logic simulation provided the automatic layout has been completed. It is therefore possible to determine if the result of the automatic layout is appropriate or not without actually producing a prototype of the circuit.

An enormous amount of information is obtained as a result of the simulation of the power supply voltage drop simulation portion S4. It is thus necessary to think out the manner in which the information is outputted with high efficiency. Some effective examples of the outputting manner will be hereinafter described.

1. The maximum value of voltage drop in the power supply wire and ground wire is outputted with respect to each of the cell rows.

2. In addition to the maximum value as described above at 1., the location at which the maximum voltage drop occurs and a pattern number of the test pattern used are outputted.

3. The potential distribution of each of the power supply wires and ground wires obtained using the test pattern having a designated pattern number is outputted.

Figure 5:
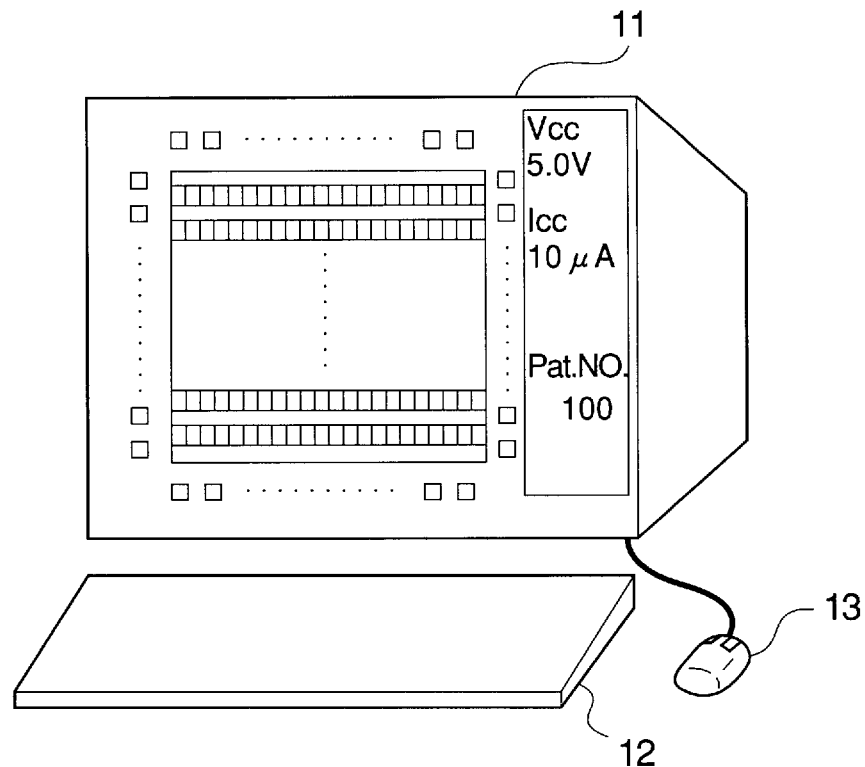
FIG. 5 is a view showing an appearance of an interactive CAD tool incorporated into the embodiment of FIG. 1.
Figure 6:
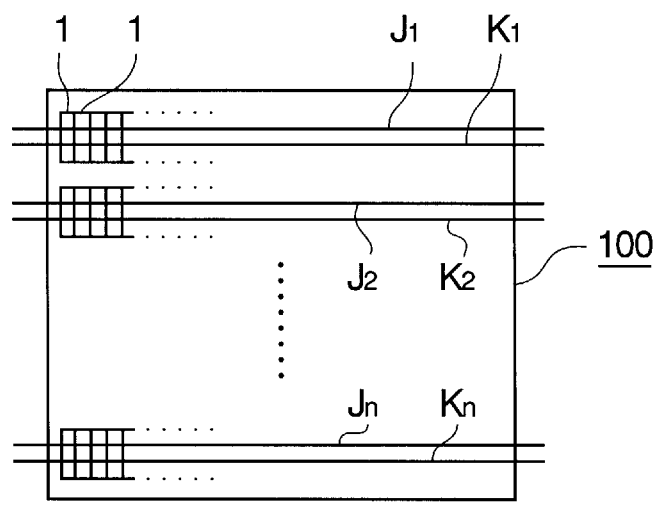
FIG. 6 is a view showing chip layout of a general gate-array device.
Figure 7:
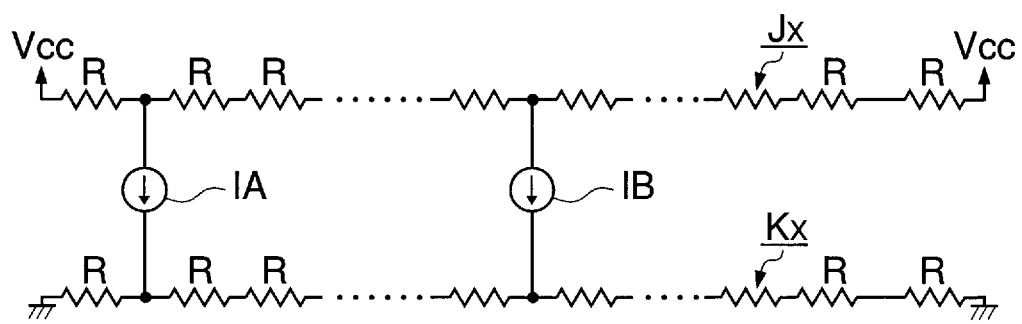
FIG. 7 is a view explaining voltage drop in the power supply wiring and ground wiring of the gate-array device.

4. It is also considered effective to provide an arrangement in which an interactive CAD tool having a keyboard 12 and a mouse 13 as shown in FIG. 5 is incorporated into the simulation apparatus of the present embodiment. In the arrangement of FIG. 5, a chip layout obtained as a result of the automatic layout processing is displayed on a display 11. The user designates observation points at which the power supply voltage should be monitored. The logic simulation portion S3 and power supply voltage drop simulation portion S4 as described above advance the simulation by one pattern each time the user enters a command through the keyboard 12, for example. The power supply voltage drop simulation portion S4 then displays on the display 11 the power supply voltage Vcc at each of the designated observation points, along with the pattern number. The power supply current Icc may be displayed along with the above voltage Vcc and pattern number. It is also possible to rank the magnitude or degree of voltage drop, and display the chip layout on the display 11 with different colors such that a voltage drop at each point on the power supply wires and others is indicated in a color corresponding to the rank of the voltage drop. With the chip layout thus displayed, circuit portions in which the power supply voltage is significantly reduced can be recognized at a first glance.

While the voltage drop in the power supply wires and the like is calculated each time the test pattern used for the simulation is advanced by one pattern in the illustrated embodiment, the average current flowing through each circuit element may be calculated throughout the simulation with all of the test patterns, and the voltage drop in the power supply wires and the like may be calculated and outputted on the basis of the calculated average current. More specifically described, the logic simulation portion S3 does not output event information each time the simulation is implemented with one test pattern, but counts the frequency of reversal of the output signal of each circuit element throughout the simulation with all of the test patterns. After completion of the logic simulation, the reversal frequency of the output signal with respect to each circuit element is reported to the power supply voltage drop simulation portion S4. The power supply voltage drop simulation portion S4 then multiplies the reversal frequency of the output signal of each circuit element by the current value of the voltage source corresponding to the circuit element, multiplies the result of the multiplication by the frequency with which the resulting product or device is actually operated, and calculates the average current flowing through the circuit element during the whole simulation using all of the test patterns. Assuming that the average current thus calculated flows through the respective circuit elements of the device, voltage drops in the power supply wires and ground wires are calculated.

The above-described CAD tool of FIG. 5 may be advantageously incorporated into the simulation apparatus of this embodiment. In this case, it is effective to display the average current of each circuit element when the chip layout is displayed on the display 11. For instance, the average current may be ranked into "large", "medium" and "small", and portions of the chip layout corresponding to the circuit elements having the large average current are displayed in red, and portions of the chip layout corresponding to the circuit elements having the medium average current are displayed in yellow, while portion of the chip layout corresponding to the circuit elements having the small average current are displayed in blue, for example. With the chip layout thus displayed, a specific measure may be easily found to deal with a cell row in which red display is outstanding. For instance, the artwork cells corresponding to the circuit elements in the cell row in which red display is outstanding are forced to be transferred to another cell row.

While the present invention is applied to gate-array devices in the illustrated and described embodiments, the invention is not limited to this application, but may be generally applied to so-called semicustom integrated circuits; which can be automatically laid out on the basis of function descriptive information.

What is claimed is:

1. A simulation apparatus for a semiconductor integrated circuit comprising:

model preparing means for preparing a feeder system model representing current sources that correspond to respective circuit elements at specific locations in a circuit to be designed, and power supply wiring and ground wiring for applying voltage to said current sources, on the basis of an automatic layout of said circuit;

logic simulating means for simulating logic of said circuit, and outputting event information related to selected ones of said circuit elements constituting said circuit, the selected ones of said circuit elements having undergone a change of a condition thereof; and power supply voltage drop simulating means for for simulating a driving of the current sources in said feeder system model that correspond to said selected ones of the circuit elements related to said event information, and computing voltage drops in said power supply wiring and said ground wiring in response to the driving of the current sources corresponding to the specific locations of the selected ones of the circuit elements.

2. A simulation apparatus for a semiconductor integrated circuit comprising:

model preparing means for preparing a feeder system model representing current sources that correspond with respective circuit elements at specific locations in a circuit to be designed, and power supply wiring and ground wiring for applying voltage to said current sources, on the basis of an automatic layout of said circuit;

logic simulating means for simulating logic of said circuit, and counting a frequency of operation of each of said circuit elements constituting said circuit; and power supply voltage drop simulating means for calculating an average current flowing through said each circuit element in said feeder system model, on the basis of a counting result of the frequency of operation of said each circuit element, and computing voltage drop in said power supply wiring and ground wiring at the specific locations of the respective circuit elements, which is to occur when said average current flows through the circuit element.

3. A method for simulating a semiconductor integrated circuit, comprising the steps of:

preparing a feeder system model representing current sources that correspond with respective circuit elements at specific locations in a circuit to be designed, and power supply wiring and ground wiring for applying voltage to said current sources, on the basis of an automatic layout of said circuit;

simulating logic of said circuit, and outputting event information related to selected ones of said circuit elements constituting said circuit, the selected ones of said circuit elements having undergone a change of a condition thereof; and simulating a driving of the current sources in said feeder system model corresponding with said selected ones of the circuit elements related to said event information, and computing voltage drop in said power supply wiring and said ground wiring in response to the driving of the current sources at the specific locations of the respective circuit elements.

4. A method for simulating a semiconductor integrated circuit, comprising the steps of:

preparing a feeder system model representing current sources that correspond with respective circuit elements at specific locations in a circuit to be designed, and power supply wiring and ground wiring for applying voltage to said current sources, on the basis of an automatic layout of said circuit;

simulating logic of said circuit, and counting a frequency of operation of each of said circuit elements constituting said circuit; and calculating an average current through said each circuit element in said feeder system model, on the basis of a counting result of the frequency of operation of each circuit element, and computing voltage drops in said power supply wiring and ground wiring at the specific locations of the respective circuit elements, which is to occur when the average current flows through said circuit element.

* * * * *